United States Patent
Schmidbauer et al.

(10) Patent No.: US 6,365,510 B2
(45) Date of Patent: Apr. 2, 2002

(54) METHOD FOR FABRICATING A CONTACT LAYER

(75) Inventors: Sven Schmidbauer; Norbert Urbansky, both of Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/811,798

(22) Filed: Mar. 19, 2001

(30) Foreign Application Priority Data

Mar. 17, 2000 (DE) ......................................... 100 14 917

(51) Int. Cl.$^7$ ..................... H01L 21/4763; H01L 21/44; C23C 14/00; C23C 14/32

(52) U.S. Cl. ..................... 438/637; 438/632; 438/672; 438/675; 438/909; 204/192.17

(58) Field of Search ................................. 438/637, 597, 438/652, 672, 675, 466, 469, 758, 909; 204/192.15, 192.17

(56) References Cited

U.S. PATENT DOCUMENTS

| | | | |
|---|---|---|---|
| 5,956,608 A | | 9/1999 | Khurana et al. |
| 5,963,827 A | | 10/1999 | Enomoto et al. |
| 6,117,279 A | * | 9/2000 | Smolanoff et al. ...... 204/192.12 |
| 6,217,721 B1 | * | 4/2001 | Xu et al. ............... 204/192.17 |
| 6,274,008 B1 | * | 8/2001 | Gopalraja et al. ...... 204/192.17 |

FOREIGN PATENT DOCUMENTS

| | | |
|---|---|---|
| DE | 43 36 357 C2 | 4/1994 |
| DE | 199 13 554 A1 | 2/2000 |
| EP | 0 717 436 A2 | 6/1996 |
| EP | 0 751 566 A2 | 1/1997 |
| JP | 006 158 299 AA | 6/1994 |

OTHER PUBLICATIONS

Hiroshi Kubota et al.: "Ion–Beam–Assisted Deposition of TiN Thin Films", Jpn. J. Appl. Phys., vol. 32, 1993, pp. 3414–3419.
S.M. Rossnagel et al.: "Metal ion deposition from ionized mangetron sputtering discharge", J. Vac. Sci. Technol., vol. B 12(1), Jan./Feb. 1994, pp. 449–453.
Y.W. Kim et al.: "Development of 111 texture in Al films grown on $SiO_2$/Si(001) by ultrahigh–vacuum primary–ion deposition", J. Vac. Sci. Technol. A14(2), Mar./Apr. 1996, pp. 346–351.
G. Zhong et al.: "Ionized titanium deposition into high aspect ratio vias and trenches", J. Vac. Sci. Technol. B 17(2), Mar./Apr. 1999, pp. 405–409.
Yoichiro Tanaka et al.: "Properties of titanium nitride film deposited by ionized metal plasma source", J. Vac. Sci. Technol., B 17(2), Mar./Apr. 1999, pp. 416–422.
Anish Tolia et al.: "Integrated IMP Ti and MOCVD TiN for 300 mm W Barrier and Liner for Sub 0.18 $\mu$m IC Processing", SPIE Conference on Multilevel Interconnect Technology III, Santa Clara, California, Sep. 1999, SPIE vol. 3883, pp. 130–136.

* cited by examiner

Primary Examiner—Richard Elms
Assistant Examiner—Adam Pyonin
(74) Attorney, Agent, or Firm—Herbert L. Lerner; Laurence A. Greenberg; Werner H. Stemer

(57) ABSTRACT

A contact layer is used, for example, as a liner for the fabrication of electrical contacts in contact holes. The contact layer is fabricated in two steps, in a first step a first contact layer is deposited, in which only a small proportion of the particles to be sputtered is ionized. In a second sputtering step, a second contact layer is sputtered, in the course of whose fabrication a larger proportion of the particles to be sputtered is ionized. The procedure ensures that the first contact layer is disposed as a protective layer on the substrate by gentle sputtering before the second contact layer is sputtered.

12 Claims, 1 Drawing Sheet

Generator

METHOD FOR FABRICATING A CONTACT LAYER

BACKGROUND OF THE INVENTION

FIELD OF THE INVENTION

The present invention relates to a method for fabricating a contact layer on a substrate.

Integrated circuits contain, inter alia, electrical components such as diodes, resistors, transistors, etc., which are connected to one another by electrical lines.

The electrical components are formed for example in a semiconductor substrate made of silicon and have doped diffusion regions as electrically conductive regions. In order to connect the doped diffusion regions to electrical lines, which are usually composed of a metal such as aluminum or copper, an insulating layer preferably made of a boron- and/or phosphorus-doped silicate glass or a silicon oxide is disposed on the substrate surface. Contact holes are formed in the insulating layer and uncover the underlying regions to be connected, such as metalization planes or doped diffusion regions.

Usually, what is called a liner layer made e.g. of titanium, titanium nitride, tantalum or tantalum nitride is deposited, which covers the silicate glass surface, the side walls of the contact hole and the regions to be electrically connected at the bottom of the contact hole, such as the diffusion region. This procedure is described in the Published, European Patent Application EP 0 751 566 A2, for example.

In this case, the liner layer serves as an adhesion layer for the subsequent metalization made of aluminum, tungsten or copper.

In addition, the liner layer has the task of acting as a barrier layer against the diffusion of aluminum, copper or respectively tungsten and gaseous substances thereof in order to protect the diffusion regions.

Furthermore, the liner layer has the task of forming a low-impedance contact between the doped diffusion region and the metal of the contact hole filling.

The deposition of a liner layer is usually carried out by a sputtering process, also called a physical vapor deposition (PVD) process. These processes are specified for example in the document by A. Tolia et al., titled "Integrated IMP Ti and MOCVD TiN for 300 mm W Barrier and Liner for Sub 0.18 $\mu$m IC Processing", SPIE Vol. 3883 (SPIE Conference on Multiload Interconnect Technology III, Santa Clara 1999) pp. 130–135.

Usually, up to approximately 95% of the particles sputtered from the sputtering target have neutral charge, with the result that they cannot be accelerated toward an electrode by an accelerating voltage. Since contact holes often have a large aspect ratio (ratio of the contact hole depth to the contact hole diameter), ionized methods of PVD layer deposition are used. Ionized PVD methods use an alternating magnetic field in which electrons are accelerated and ionize the particles through impacts on their way from the sputtering target to the substrate to be coated. The ionized particles can be accelerated toward the substrate and strike the substrate approximately perpendicularly, with the result that the contact holes are covered at their bottom.

The disadvantage of ionized PVD methods resides in the severe damage to the doped diffusion regions caused by the high striking energy of the particles, which lead to crystal imperfections and crystal dislocations and severe charging effects.

Furthermore, it is disadvantageous that the silicate glass layer can be eroded on a side wall of the contact hole. As a result of which silicon oxide is incorporated from the side wall, at the bottom of the contact hole, on the diffusion region and hence into the contact layer, which leads to an increase in the contact resistance.

SUMMARY OF THE INVENTION

It is accordingly an object of the invention to provide a method for fabricating a contact layer that overcomes the above-mentioned disadvantages of the prior art devices of this general type, in which a contact layer is deposited having a reduced contact resistance.

With the foregoing and other objects in view there is provided, in accordance with the invention, a method for fabricating a contact layer. The method includes the steps of providing a substrate in a sputtering chamber, disposing a dielectric layer on the substrate, forming a trench in the dielectric layer, producing a plasma in the sputtering chamber, and sputtering a first contact layer in the trench in a first step. In the sputtering chamber, the number of ionized particles in relation to the total number of particles during the first step is less than 5%. Next, a second contact layer is sputtered onto the first contact layer in a second step, in the sputtering chamber the number of ionized particles in relation to the total number of particles during the second step being greater than 5%.

Ionized particles are understood to be, for example, ionized atoms, ionized crystallites, ionized macromolecules or else ionized clusters, depending on the number and type of bond of the atoms of a particle.

The advantage of the method according to the invention resides in the gentle sputtering of a first contact layer, which serves as protection for the sputtering of a second contact layer. Damage to a doped diffusion region disposed at the bottom of a trench in a substrate can thereby be avoided. In addition, erosion of silicon oxide from the trench side walls is reduced by the protective layer, with the result that less silicon oxide is incorporated into the contact layer at the bottom of the trench. This advantageously reduces the contact resistance, which results in a low-impedance contact. This procedure makes it possible for the ionization rate of the particles to be sputtered to be kept low in the first step. This reduces the damage to the doped diffusion regions at the bottom of the trench and the damage or the silicon oxide erosion on the trench side walls.

In addition, the combination of a first contact layer with a second contact layer which is sputtered by an ionized PVD method improves the coverage on the bottom of the trench, thereby even trenches having a high aspect ratio can be provided with a contact layer.

In an advantageous instance of the method according to the invention, in the second step, an alternating magnetic field is present in the sputtering chamber. This advantageously makes it possible for directed sputtering to be carried out using an electric field, in the course of which sputtering even trenches having a high aspect ratio are covered on the bottom and the side walls with particles to be sputtered. Furthermore, it is advantageous for the pressure in the sputtering chamber to be lower in the first step than in the second step. An advantageous development provides for the pressure in the sputtering chamber to be 2 to 50 times lower in the first step than in the second step. The lower pressure results in that it is possible to reduce the number of ionized particles in the first step in comparison with the second step, which leads to less damage to the doping region in the first step. As a result, it is possible to reduce the ionization rate of the particles to be sputtered, thereby reducing the damage to the doped diffusion regions at the bottom of the trench and the damage or the silicon oxide erosion on the trench side walls. Pressures of 0.1333 Pa to 6.665 Pa (1 to 50 mTorr) are usually used for sputtering processes.

A further advantageous variant of the method according to the invention provides for the substrate to be disposed on a support and an electrode to be disposed on that side of the substrate which faces the support, an alternating voltage being applied to the electrode during the second step. This procedure is referred to as a back sputtering process. In this case, the material sputtered onto the substrate is removed again from the substrate at a low rate. This leads to an improved coverage of the trench bottom, which is an advantage in the case of trenches having a high aspect ratio since the trench bottom is difficult to cover in this case.

It is advantageous, furthermore, that in the sputtering chamber, in the first step, the number of ionized particles in relation to the total number of particles is less than 2%. This procedure reduces damage to the doping region by ionized particles.

It is advantageous, moreover, that in the sputtering chamber, in the second step, the number of ionized particles in relation to the total number of particles is greater than 40%. This procedure makes it possible to achieve an improved coverage of the trench bottom in the second step.

In accordance with another mode of the invention, there is the step of forming the first contact layer and the second contact layer with a substantially conformal layer thickness. In addition, it is preferable that the first and second contact layers are formed from the same chemical element.

In a further advantageous instance of the method according to the invention, the particles to be sputtered have a lower kinetic energy in the first step than in the second step. This procedure likewise reduces damage to the doping region. In a particularly advantageous instance of this method, the particles to be sputtered have a kinetic energy that is less than 10 eV in the first step. In the second step, a kinetic energy of the particles of more than 100 eV is advantageous.

Other features which are considered as characteristic for the invention are set forth in the appended claims.

Although the invention is illustrated and described herein as embodied in a method for fabricating a contact layer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE DRAWINGS

Figure 1:
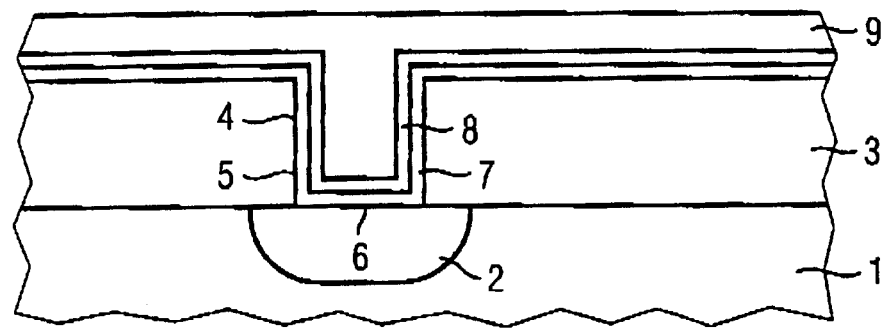
FIG. 1 is a diagrammatic, sectional view of a contact layer sputtered according to the invention.

In all the figures of the drawing, sub-features and integral parts that correspond to one another bear the same reference symbol in each case. Referring now to the figures of the drawing in detail and first, particularly, to FIG. 1 thereof, there is shown a substrate 1 in which a diffusion region 2 is disposed. Usually, the substrate 1 is made of silicon and the diffusion regions 2 are doped with boron, phosphorus or arsenic. A dielectric layer 3 is disposed on the substrate 1, the dielectric layer 3 usually is formed of a doped silicate glass. A trench 4 is formed in the dielectric layer 3, the trench 4 at least partly uncovering the diffusion region 2. The trench 4 is a contact hole, for example. A first contact layer 7 is disposed on the dielectric layer 3, side walls 5 of the trench 4 and a trench bottom 6. A second contact layer 8 is disposed on the first contact layer 7.

The substrate 1 is usually a support material that may be formed from silicon. The diffusion region 2 constitutes e.g. a source-drain contact 2 of a transistor. In this exemplary embodiment, the dielectric layer 3 has the function of an intermetallic dielectric. The first contact layer 7 and the second contact layer 8 have the function of an adhesion layer, which bond a metal layer 9 that is subsequently deposited in the trench 4. Furthermore, the first contact layer 7 and the second contact layer 8 have the function of a diffusion barrier that protects the diffusion region 2 from the metal layer 9. Moreover, the first contact layer 7 and the second contact layer 8 have the function of enabling a low-impedance junction between the metal layer 9 and the diffusion region 2.

The configuration illustrated in FIG. 1 is usually fabricated by providing the substrate 1 with the diffusion region 2 introduced therein. The dielectric layer 3 is subsequently deposited onto the substrate 1 and is patterned in such a way that the trench 4 is produced. The trench 4 is usually formed such that the diffusion region 2 is at least partly uncovered. The surface of the uncovered diffusion region 2 is subsequently cleaned in a cleaning step. In a two-stage sputtering process that then follows, titanium is sputtered. First, the first contact layer 7 is formed, an alternating voltage not being applied to an electrode 11 (FIG. 2) disposed in the vicinity of the substrate 1. The ionization can thereby be kept low. In the next method step, the second contact layer 8 is sputtered, an alternating voltage being applied to the electrode 11 disposed in the vicinity of the substrate 1 during the sputtering process. The alternating voltage has the effect of accelerating ions in a directed manner into the region of the contact hole 4, which leads to a higher degree of coverage of the bottom 6 of the contact hole 4. In a subsequent process, the metal layer 9 is applied to the second contact layer 8.

An alternative method for fabricating the structure illustrated in FIG. 1 sputters the first contact layer 7 by pressure in a sputtering chamber 10 being a factor of 2 to 50 lower than the pressure in the sputtering chamber 10 during the sputtering of the second contact layer 8. The sputtering chamber 10 is usually filled with argon, and the argon pressure in the sputtering chamber is preferably set to about 0.5332 Pa (4 mTorr) during the sputtering of the first contact layer 7. The pressure is increased to about 35 mTorr during the sputtering of the second contact layer 8.

As an alternative, after the two sputtering processes mentioned, a titanium nitride layer can be grown by a PVD/CVD method.

Afterward, the substrate is cooled and removed from the sputtering installation.

In a subsequent temperature step, the sputtered titanium is converted in a nitrogen-containing atmosphere with the silicon of the diffusion region at least partially to form a titanium nitride and a titanium silicide.

Figure 2:
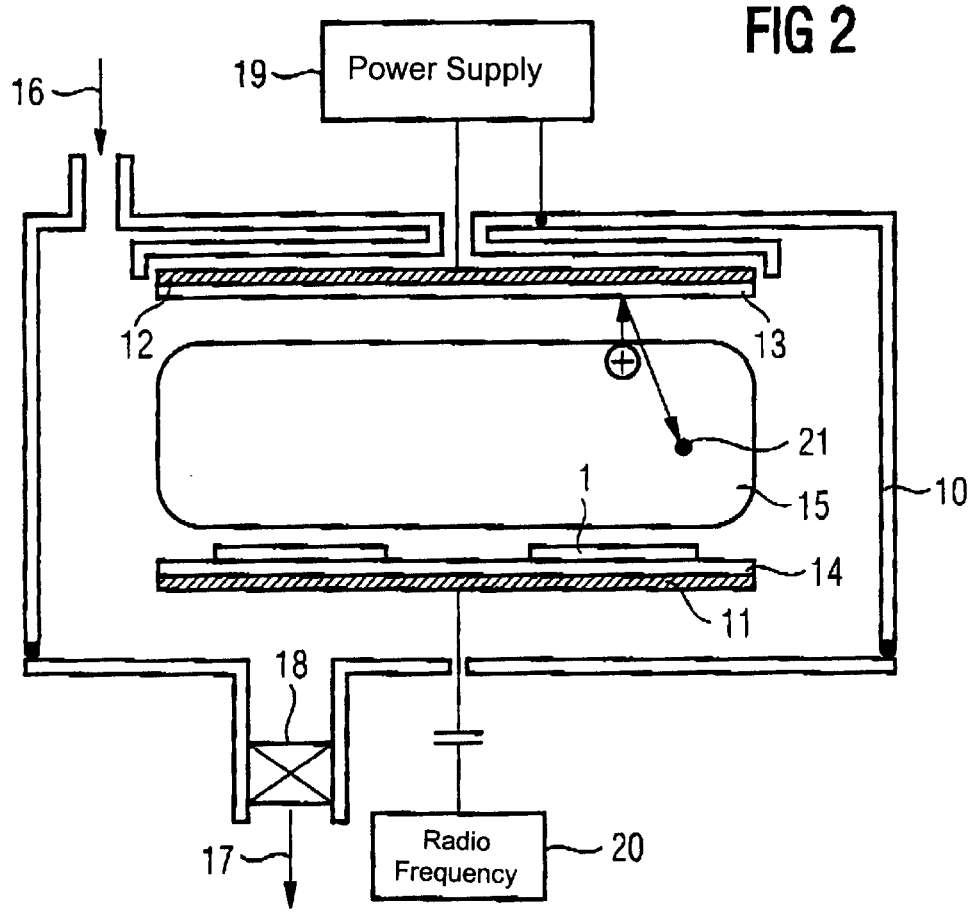
FIG. 2 is a sectional view of a sputtering chamber.

FIG. 2 illustrates a sputtering installation containing the sputtering chamber 10, in which the electrode 11 and a cathode 12 are disposed. A sputtering material 13 (sputtering target) is disposed on the cathode 12. A support 14, on which the substrate 1 is disposed, is disposed on the electrode 11. The sputtering chamber 10 contains an argon plasma 15 containing positively charged argon ions. The sputtering chamber 10 is filled with argon through a gas inlet 16 and evacuated through a gas outlet 17 having a pump 18. A power supply 19 (DC voltage or radio frequency are possible) is connected to the cathode 12 and accelerates argon ions onto the sputtering material, with the result that particles 21 to be sputtered are dislodged from the sputtering material 13. The dislodged particles 21 to be sputtered can be ionized by an additional alternating magnetic field. The ionized particles 21 to be sputtered are accelerated toward the substrate 1 by an electric field. An alternating voltage may additionally be applied to the electrode 11 by a radio-frequency generator 20, resulting in an improvement in the bottom coverage in the contact hole 4 and also in back sputtering processes (known in the literature) on the substrate 1.

The contact layer can be formed, for example, by a method for fabricating a contact layer by sputtering the particles 21. The substrate 1 is placed in the sputtering chamber 10, the dielectric layer 3 is disposed on the substrate 1, and the trench 4 is formed in the dielectric layer 3. A plasma is produced in the sputtering chamber 10 and sputtering the first contact layer 7 in the trench 4 is performed in a first step. The second contact layer 8 is sputtered onto the first contact layer 7 in a second step, in which case, in the sputtering chamber 10 the number of ionized particles 21 in relation to the total number of particles is smaller in the first step than in the second step.

We claim:

1. A method for fabricating a contact layer, which comprises the steps of:
   providing a substrate in a sputtering chamber;
   disposing a dielectric layer on the substrate;
   forming a trench in the dielectric layer;
   producing a plasma in the sputtering chamber;
   sputtering a first contact layer in the trench in a first step, in the sputtering chamber a number of ionized particles in relation to a total number of particles during the first step being less than 5%; and
   sputtering a second contact layer onto the first contact layer in a second step, in the sputtering chamber the number of ionized particles in relation to the total number of particles during the second step being greater than 5%.

2. The method according to claim 1, which comprises during the second step, an alternating magnetic field is present in the sputtering chamber.

3. The method according to claim 1, which comprises setting a pressure in the sputtering chamber to be lower during the first step than during the second step.

4. The method according to claim 3, which comprises setting the pressure in the sputtering chamber to be 2 to 50 times lower in the first step than in the second step.

5. The method according to claim 1, which comprises:
   disposing the substrate on a first side of a support;
   disposing an electrode on a second side of the support; and
   applying an alternating voltage to the electrode during the second step.

6. The method according to claim 1, which comprises during the first step, setting the number of ionized particles in relation to the total number of particles to be less than 2% in the sputtering chamber.

7. The method according to claim 1, which comprises during the second step setting the number of ionized particles in relation to the total number of particles to be greater than 40% in the sputtering chamber.

8. The method according to claim 1, which comprises forming the first contact layer and the second contact layer with a substantially conformal layer thickness.

9. The method according to claim 1, which comprises forming the first contact layer and the second contact layer with a same chemical element.

10. The method according to claim 1, which comprises setting a kinetic energy of the particles to be sputtered to be lower in the first step than in the second step.

11. The method according to claim 1, which comprises setting a kinetic energy of the particles to be sputtered to be less than 10 eV in the first step.

12. The method according to claim 1, which comprises setting a kinetic energy of the particles to be sputtered to be greater than 100 eV in the second step.

* * * * *